(12) United States Patent
Nagamine et al.

(10) Patent No.: US 11,997,784 B2
(45) Date of Patent: May 28, 2024

(54) IMAGE FORMING APPARATUS HAVING CIRCUIT BOARD POSITIONED TO MINIMIZE DAMAGE FROM DROPS DURING SHIPPING

(71) Applicant: CANON KABUSHIKI KAISHA, Tokyo (JP)

(72) Inventors: Shogo Nagamine, Kanagawa (JP); Masaki Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 17/405,769

(22) Filed: Aug. 18, 2021

(65) Prior Publication Data

US 2022/0071001 A1    Mar. 3, 2022

(30) Foreign Application Priority Data

Aug. 27, 2020  (JP) ................................. 2020-143731

(51) Int. Cl.
*G03G 15/00*    (2006.01)
*H05K 1/02*    (2006.01)
*H05K 5/00*    (2006.01)

(52) U.S. Cl.
CPC ........... *H05K 1/0271* (2013.01); *G03G 15/80* (2013.01); *H05K 5/0026* (2013.01)

(58) Field of Classification Search
USPC ....................................................... 399/90
See application file for complete search history.

(56) References Cited

U.S. PATENT DOCUMENTS

2016/0109848 A1*  4/2016  Ohata ................ G03G 21/1619
                                                     399/107
2019/0007141 A1   1/2019  Kawata et al. ...... H04B 10/505
(Continued)

FOREIGN PATENT DOCUMENTS

JP    S58-158486 U    10/1983
JP    S61-129391 U    8/1986
JP    H08-335785     12/1996
(Continued)

OTHER PUBLICATIONS

Computer Translation of JP2014-066915A to Kitajima (Year: 2014).*
(Continued)

*Primary Examiner* — Quana Grainger
(74) *Attorney, Agent, or Firm* — Venable LLP (57) ABSTRACT

An image forming apparatus includes an image forming portion, a frame, which is a part of a main assembly frame, extending along a predetermined plane, a cover provided outside of the frame and extending along the predetermined plane and a circuit board, provided between the frame and the cover with in a direction perpendicular to the predetermined plane and extending along the predetermined plane. An opening portion penetrating the circuit board is formed in the circuit board. The frame includes a first abutting portion protruding toward the circuit board and the cover includes a second abutting portion protruding toward the circuit board. The first and second abutting portions are opposite to each other via the circuit board and positioned in an area where the opening portion of the circuit board is sandwiched therebetween in the direction perpendicular to the predetermined plane.

17 Claims, 8 Drawing Sheets

(56) References Cited

U.S. PATENT DOCUMENTS

2021/0240126 A1    8/2021  Nagamine et al. ..........................
                                                    G03G 2221/1654
2021/0240128 A1    8/2021  Sato .................. H04N 1/00519

FOREIGN PATENT DOCUMENTS

| JP | 2009-103894    |   | 5/2009 |
|----|----------------|---|--------|
| JP | 2012-185207    |   | 9/2012 |
| JP | 2014066915 A   | * | 4/2014 |
| JP | 2014-099572    |   | 5/2014 |
| JP | 2015118143 A   | * | 6/2015 |
| JP | 2016-136193    |   | 7/2016 |
| JP | 2017-022224    |   | 1/2017 |
| JP | 2019-012898    |   | 1/2019 |

OTHER PUBLICATIONS

Computer Translation of JP2015-118143A, cited above, (Year: 2015).*
Japan 2014-066915, Office Action dated Jun. 29, 2023.
Japan 2015-118143, Allowance dated Dec. 14, 2023.
Japan H08-335785, IDS dated Aug. 30, 2021.
Office Action dated Mar. 12, 2024 in counterpart Japanese Application No. 2020-143731, together with English translation thereof.

\* cited by examiner

IMAGE FORMING APPARATUS HAVING CIRCUIT BOARD POSITIONED TO MINIMIZE DAMAGE FROM DROPS DURING SHIPPING

FIELD OF THE INVENTION AND RELATED ART

The present invention relates to an image forming apparatus, such as a copying machine and a printer, which uses an electrophotographic image forming method.

An image forming apparatus is fitted with various components and/or units, for example, a process cartridge for forming an image on recording medium, a fixing device for fixing a toner image to recording medium by heating the toner image, a laser scanner for forming an electrostatic latent image on a photosensitive drum, etc. It sometimes occurs that an image forming apparatus falls while it is transported. As it falls, the components, units, etc., with which it is fitted, are subjected to impacts. These impacts sometimes deform and/or damage the components, units, etc., causing thereby the image forming apparatus to malfunction. Therefore, various measures are taken to minimize the effects of the fall which sometimes occurs during the transportation of an image forming apparatus. For example, an image forming apparatus is packaged with the use of packaging material such as foamed Styrofoam. Further, one or more components which are shaped to be resistant to impact, and/or formed of a substance which is resistant to impact, are placed between the heavy components and packaging material to cause the impact attributable to the fall to efficiently dispersed into the packaging material, or to be absorbed by the packaging material, in order to prevent the components, units, etc., of the image forming apparatus, which are involved in the image forming function of the image forming apparatus, from substantially deforming and/or being damaged.

It is desired that the components which are sandwiched between a heavy component and packaging material to transmit the impact which results from the heavy components during the fall do not include a printed circuit board, which has the control portion which controls the image formation process, and power supply to various units. However, because of the structure of an image forming apparatus, a printed circuit board is likely to be positioned next to the heavy components and units. Therefore, in a case where it is difficult to transmit the impact into packaging material without involving a printed circuit board, the impact from the fall has to be transmitted through the printed circuit board. For example, there is proposed in Japanese Laid-open Patent Application No H08-335785, a circuit board case which is provided with a set of ribs which face the top surface of the circuit board, and another set of ribs which face the bottom surface of the circuit board, to sandwich the circuit board with these ribs to transmit the impact through the circuit board to protect the components on the circuit board.

A printed circuit board requires "creepage distance" for preventing the leak currents and electromagnetic noises. One of the methods for providing a printed circuit board with the necessary "creepage distance" without increasing a printed circuit board in size is to provide the substrate of a printed circuit board with holes (openings) such as slits. This method, however, has a problem. That is, in a case where an image forming apparatus is structured so that the impact resulting from the fall of the image forming apparatus transmits to printed circuit board, the impact from the fall is likely to cause the stress from the impact to concentrate to the adjacencies of each hole. Thus, a printed circuit board, the substrate of which is provided with holes, is less resistant to such load as the impact resulting from a fall than a printed circuit board, the substrate of which has no hole. In a case where a method for sandwiching a printed circuit board with pressing ribs is applied to a printed circuit board, the substrate of which is provided with holes, it is sometimes impossible to place the pressing ribs a sufficient distance away from holes. If the distance from a pressing rib to the corresponding hole is insufficient, the stress from the impact which results from the fall of an image forming apparatus concentrates to the edge portions of the hole, making it possible for the printed circuit board to break. Therefore, it is impossible to provide the substrate of a printed circuit board with holes for providing a printed circuit board with "creepage distance", which in turn makes it difficult to reduce a printed circuit board in size.

SUMMARY OF THE INVENTION

The present invention was made in consideration of the situation described above. Its primary object is to prevent the problem that a printed circuit board, the substrate of which is provided with holes for providing the printed circuit board with "creepage distance" is damaged by the impact resulting from the fall of an image forming apparatus.

In order to solve the problems described above, an image forming apparatus which is in accordance with the present invention is structured as follows:

There is provided an image forming apparatus comprising: an image forming portion configured to form an image on a recording material; a frame, which is a part of a main assembly frame configured to support said image forming portion, extending along a predetermined plane; a cover provided outside of said frame and extending along the predetermined plane; and a circuit board, provided between said frame and said cover with respect to a direction perpendicular to the predetermined plane and extending along the predetermined plane, configured to control said image forming portion, said circuit board including an opening portion penetrating said circuit board, wherein said frame includes a first abutting portion protruding toward said circuit board and said cover includes a second abutting portion protruding toward said circuit board, and wherein said first abutting portion and said second abutting portion are opposite to each other via said circuit board and positioned in an area where said opening portion of said circuit board is sandwiched therebetween with respect to the direction perpendicular to the predetermined plane.

Further features of the present invention will become apparent from the following description of exemplary embodiments (with reference to the attached drawings).

DESCRIPTION OF THE EMBODIMENTS

Hereinafter, the present invention is described in detail with reference to a couple of preferred embodiments of the present invention, and appended drawings.

Embodiment 1

[Structure of Image Forming Apparatus]

Figure 1:
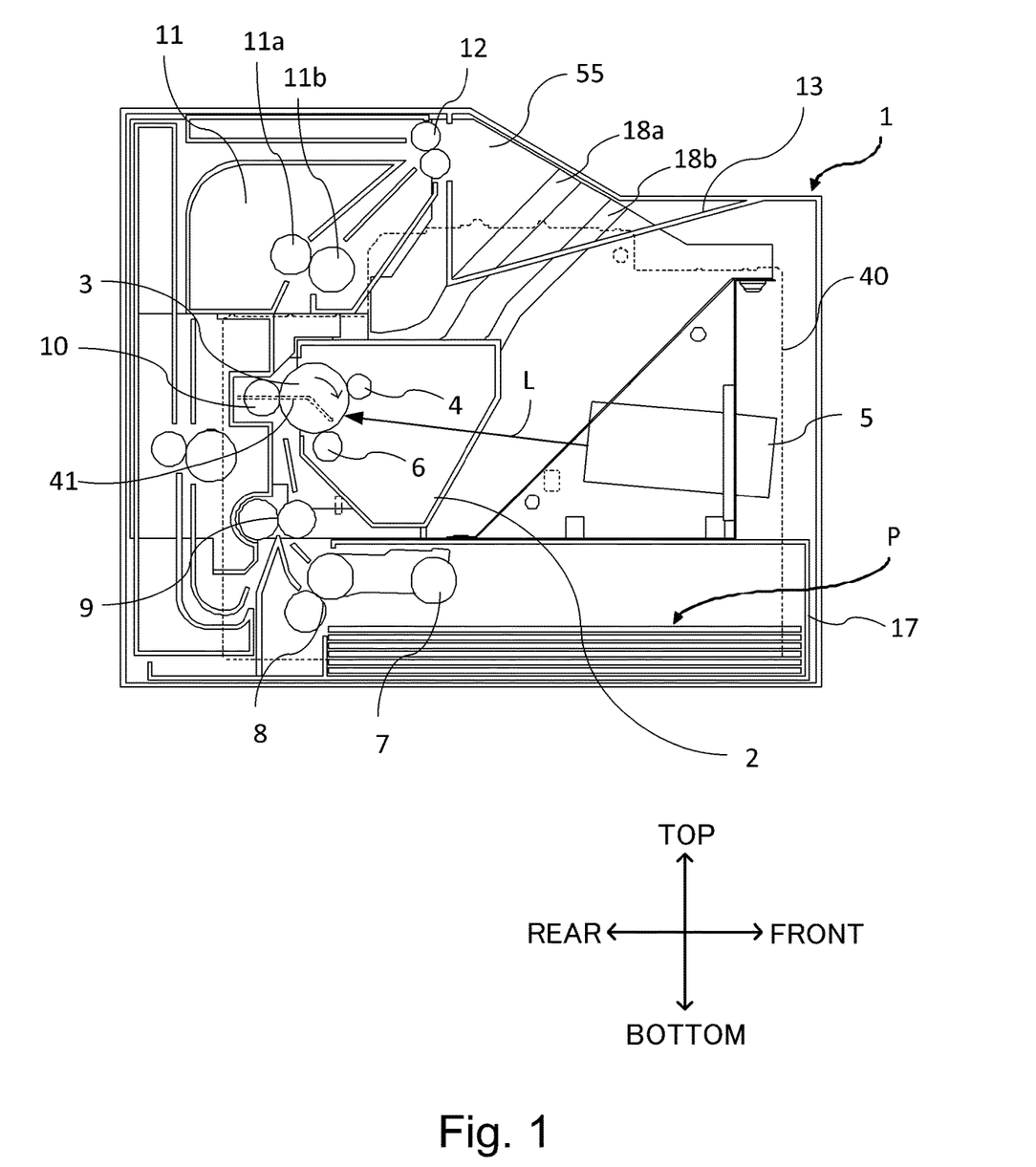
FIG. 1 is a sectional view of the image forming apparatus in the first and second embodiments; it shows the structure of the apparatus.

FIG. 1 is a schematic sectional view of the image forming apparatus 1 in the first embodiment of the present invention. It shows the structure of the image forming apparatus 1. The image forming apparatus 1 has: a feeding portion for feeding a sheet P of recording medium into the main assembly of image forming apparatus 1; an image forming portion which comprises a process cartridge, etc., for forming a toner image (image formed of developer) on the sheet P; and fixing device 11 for fixing the toner image on the sheet P to the sheet P. Here, by the way, the image forming apparatus 1 is an electrophotographic image forming apparatus. It is a monochromatic image forming apparatus, in which a single process cartridge 2 is removably installable.

The process cartridge 2 has: a photosensitive drum 3 which is a rotatable image bearing member; a charge roller 4 for charging the photosensitive drum 3; and a development roller 6 for developing an electrostatic latent image formed on the photosensitive drum 3, with the use of toner. The photosensitive drum 3 is uniformly charged to a preset potential level by the charge roller 4. Then, the photosensitive drum 3 is exposed to a beam L of laser light projected from an exposing apparatus 5 while being modulated with the information of the image to be formed. Beam L of laser light scans the peripheral surface of photosensitive drum 3. As a result, an electrostatic latent image is formed on the photosensitive drum 3. Then, the electrostatic latent image on the photosensitive drum 3 is developed into a toner image, or a visible image, by a development roller 6, with the use of toner (developer).

On the other hand, the feeding portion comprises a pickup roller 7, a feed roller 8, feeder cassette 17, etc. The feeder cassette 17 can hold multiple sheets P of recording medium, in layers. The sheets P of recording medium in the feeder cassette 17 are delivered one by one to a conveyance roller 9 by a combination of the pickup roller 7 and the feed roller 8, in synchronism with the formation of a toner image on the photosensitive drum 3. Then, the sheet P of recording medium is conveyed by the conveyance roller 9 to a transfer nip formed by a combination of the photosensitive drum 3 and a transfer unit 10. In the transfer nip, the toner image on the photosensitive drum 3 is transferred onto the sheet P by the transfer roller 10.

After the transfer of the toner image onto the sheet P, the sheet P is conveyed to a fixing device 11, which is a fixing means, to carry out the fixing process for fixing the unfixed toner image to the sheet P. A fixing device 11 has a drive roller 11a, and a fixation roller 11b which contains a heater. The sheet P is heated and pressed by a combination of the drive roller 11a and the fixation roller 11b. Consequently, the unfixed toner image becomes fixed to sheet P. Thereafter, the sheet P is conveyed by a discharge roller 12 onto a delivery tray 13 to be layered upon the sheets on the delivery tray 13. This concludes image formation.

Figure 2:
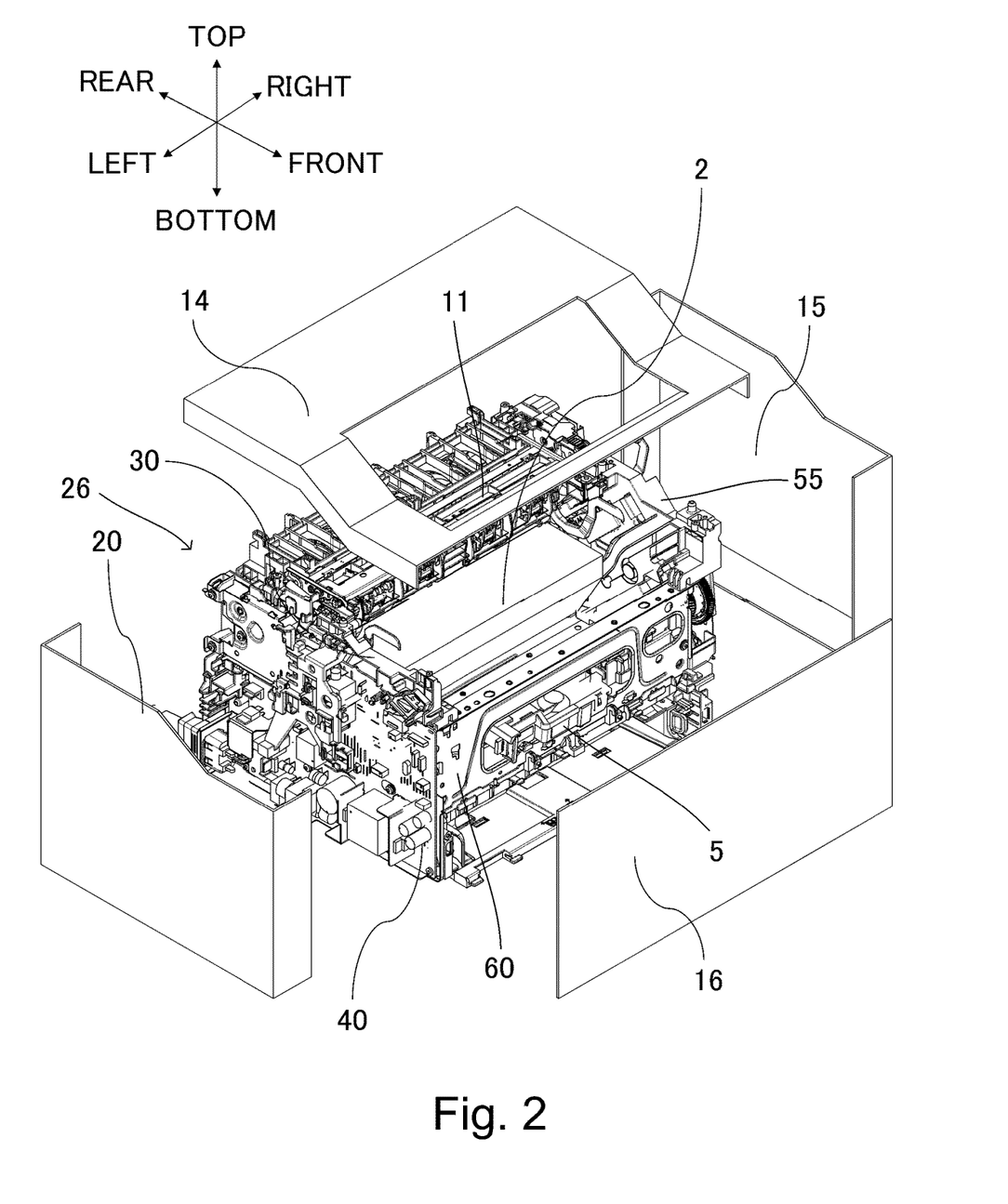
FIG. 2 is a partially exploded perspective view of the image forming apparatus in the first and second embodiments; it shows the cover of the apparatus, and the internal structure of the apparatus.

By the way, in the following description of the present invention, the upstream and downstream sides of the image forming apparatus 1, in terms of the direction in which the sheet P is discharged from the image forming apparatus 1 by the discharge roller 12, is referred to as "rear" and "front", respectively, of image forming apparatus 1. Further, when the image forming apparatus 1 is seen from the front-to-rear direction, the right and left sides in terms of the direction parallel to axial line of photosensitive drum 3 is referred to as "right" and "left", respectively (FIG. 2). Further, the top and bottom sides in terms of the vertical direction are referred to as "top" and "bottom", respectively.

Further, the image forming apparatus 1 is provided with a main frame 26 (FIG. 2), which will be described later, to support the feeding portion, image forming portion such as the process cartridge 2, and the fixing device 11, which were described above. Moreover, the image forming apparatus 1 is provided with a right frame 55 and a left frame 30, which are on the right and left sides of the process cartridge 2. The right frame 55 and the left frame 30 have insertion-extraction guides 18a and 18b (those on left frame side are not illustrated) for guiding removably installable the process cartridge 2 when they are removed or installed. By the way, the insertion-extraction guides on the left frame 30 side are similar in structure to the insertion-extraction guides 18a and 18b of right frame 55, being shaped like a groove in cross-section. They are symmetrically position relative to the insertion-extraction guide 18a and 18b with reference to a plane perpendicular to the direction parallel to the axial line of the photosensitive drum 3. Thus, process cartridge 2 is removably installable in the image forming apparatus 1, with a boss 19 (FIG. 4), which has a bearing for the axle of the photosensitive drum 3, being guided by the insertion-extraction guides 18a and 18b of the right frame 55, and those (unshown) of the left frame 30.

Further, referring to FIG. 1, the shape formed by a broken line shows the contour of printed circuit board 40 (which hereafter will be referred to simply as "circuit board 40"), which will be described later. The Circuit board 40 is provided with a hole 41, which is a through hole, to provide the circuit board 40 with a creepage distance. It is evident from FIG. 1 that the hole 41 is positioned so that it overlaps with the photosensitive drum 3 which is cylindrical, as seen from the direction parallel to the rotational axis of the photosensitive drum 3, more precisely, the extension of the rotational axis of the photosensitive drum 3 intersects with the hole 41.

[Internal Structure of Image Forming Apparatus, and Exterior Cover]

FIG. 2 is a partially exploded perspective view of the image forming apparatus 1. It shows the internal structure of the image forming apparatus 1, and the exterior cover of the image forming apparatus 1. Further, it shows the image forming apparatus 1 when the feeder cassette 17 shown in FIG. 1 is not in the image forming apparatus 1.

Referring to FIG. 2, a main assembly frame 26 comprises: a right frame 55 which is a lateral frame; a left frame 30 which also is a lateral frame; a front frame 60; and a rear frame (unshown). The right frame 55 is such a frame that is positioned on the right side of the main assembly frame 26. It supports the right side of the process cartridge 2 described above. On the other hand, the left frame 30 is such a frame that supports the left side of the main assembly frame 26. The front frame 60 is such a frame that is positioned on the front side of the main assembly frame 26. The rear frame is such a frame that supports the conveyance roller 9, and also, that the installation of the process cartridge 2 in the main assembly frame 26 creates a recording medium conveyance passage between the process cartridge 2 and the rear frame. Further, the components for forming an image on above described sheet P of recording medium, and an image forming member which is in the form of a unit, are positioned in the main assembly frame 26 formed by assembling the right frame 55, the left frame 30, the front frame 60, and the rear frame, and are supported by the main assembly frame 26. FIG. 2 shows the process cartridge 2, the fixing device 11, the exposing apparatus 5, etc., are in the main assembly frame 26, being supported by the main assembly frame 26. By the way, in this embodiment, the right frame 55, the left frame 30, and the rear frame are formed of a resinous substance, whereas the front frame 60 is formed of a piece of a metallic plate.

Further, the image forming apparatus 1 is fitted with a top cover 14, a right cover 15, a front cover 16, a left cover 20, and a rear cover (unshown), which are for protecting the image forming members positioned in the main assembly frame 26, and the exterior covers attached to the main assembly frame 26. The top cover 14 is attached to the top portion of main assembly frame 26. The right cover 15 is attached to the right frame 55. Front cover 16 is attached to front frame 60. Similarly, the left cover 20 is attached to left frame 30, and the rear cover is attached to the rear side of the main assembly frame 26. By the way, the top cover 14, the right cover 15, the front cover 16, the left cover 20, and rear cover are also formed of a resinous substance.

Further, referring to FIG. 2, it is on the portion of the surface of the left frame 30, which opposes the left cover 20 (which faces the left side of the main assembly frame 26) that the circuit board 40 is attached). The circuit board 40 has: the control portion which controls the image forming apparatus 1; parts for the electrical power source for supplying the process cartridge 2, the fixing device 11, the exposing apparatus 5, etc., with electrical power. For example, if the image forming apparatus 1 falls in such an attitude that the left frame 30 faces downward while the image forming apparatus 1 is transported, the circuit board 40 is subjected to the impact resulting from heavy objects such as the process cartridge 2, resulting in damages and/or troubles to the substrate of the circuit board 40 and/or the circuit components on the substrate, which in turn may create such a situation that the image forming apparatus 1 does not normally operate. Therefore, such a measure must be taken that can prevent the circuit board 40 from breaking even if the image forming apparatus 1 falls during its transportation.

[Structure of Circuit Board 40]

Figure 3:
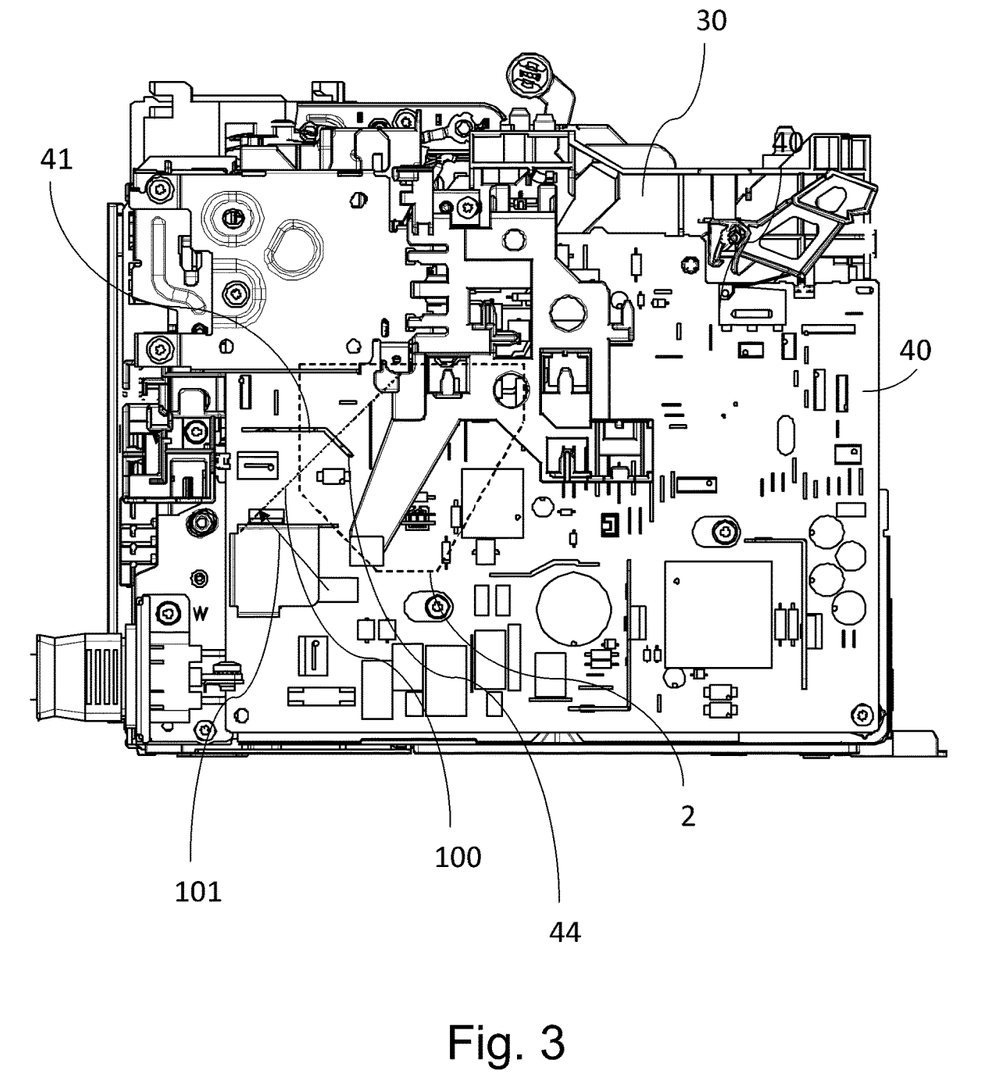
FIG. 3 is a schematic drawing for describing the positioning of the printed circuit board and process cartridge in the first and second embodiments.

FIG. 3 is a front view of the circuit board 40 as seen from the left cover 20 side, toward left frame 30 with reference to FIG. 2. The circuit board 40 is on the left frame 30 by being fixed thereto with small screws. Referring to FIG. 3, there are circuit components, cable connectors, etc., on the left cover 20 side of the circuit board 40. As described above, circuit board 40 has: the control portion which has CPU which controls the image forming apparatus 1, a ROM, and a RAM; and an electrical power source which generates voltage to supply various internal portions of the image forming apparatus 1 with electric power.

The image forming apparatus 1 has such components that are to be supplied with high voltage as power source voltage, and such components that are supplied with low voltage. The components, which are supplied with high voltage as electric power source voltage include the charge roller 4, the development roller 6, the transfer unit 10, etc., described above. The components which are to be supplied with low voltage include motors (unshown) for driving the photosensitive drum 3, the charge roller 4, the development roller 6, the transfer unit 10, etc., the control portion, etc. It has to be ensured that the circuit board 40 is provided with creepage distance which is necessary to prevent electric current flowing between the electric power source for generating high voltage, and the electric power source for generating low voltage, and also, to prevent the occurrence of electromagnetic noises. Therefore, the substrate of the circuit board 40 is provided with slits for ensuring that the circuit board 40 is provided with a sufficient creepage distance for preventing the occurrence of leakage current and/or electromagnetic noises, by spatially widening the distance between adjacent two circuit patterns. Providing the substrate of the circuit board 40 with slits makes it possible to ensure that the circuit board 40 is provided with necessary creepage distance without increasing the substrate in size, thereby making it possible to reduce the circuit board 40 in size in terms of two-dimension.

In this embodiment, therefore, the substrate of the circuit board 40 is provided with the hole 41, more specifically, a slit which has two sections connected to each other at an angle, to provide a sufficient creepage distance between the electrical power source for generating high voltage, and electrical power source for generating low voltage. Also referring to FIG. 3, the broken line represents the contour of the process cartridge 2 shown in FIG. 1. The process cartridge 2 has a portion which overlaps with the hole 41. Referring to FIGS. 2 and 3, the circuit board 40 has a roughly similar size to the left frame 30. Therefore, if the image forming apparatus 1 happens to fall, with left frame 30 being on the bottom side as described above during its transportation, it is impossible to prevent the circuit board 40 from being subjected to the impact from the process cartridge 2 which is a heavy object. In this embodiment, therefore, the substrate of the circuit board 40 is provided with the hole 41, which coincides in position with the portion of the substrate, which is subjected to the impact from the photosensitive drum 3 which is one of the heavy objects in process cartridge 2.

[Positional Relationship Among Hole of Substrate of Circuit Board, Main Assembly Frame, and Damping Portion of Exterior Cover]

As described above, in terms of the left-right direction in FIG. 2, the process cartridge 2 and the circuit board 40 overlap with each other. Therefore, if the image forming apparatus 1 happens to fall, with its left side (FIG. 2) facing downward, the impact generated by the process cartridge 2 due to the fall transmits to the left frame 30 by way of the photosensitive drum 3. As a result, it sometimes occurs that not only is the left frame 30 made to deform, but also, the circuit board 40 is made to deform, and/or circuit components are damaged.

Figure 4:
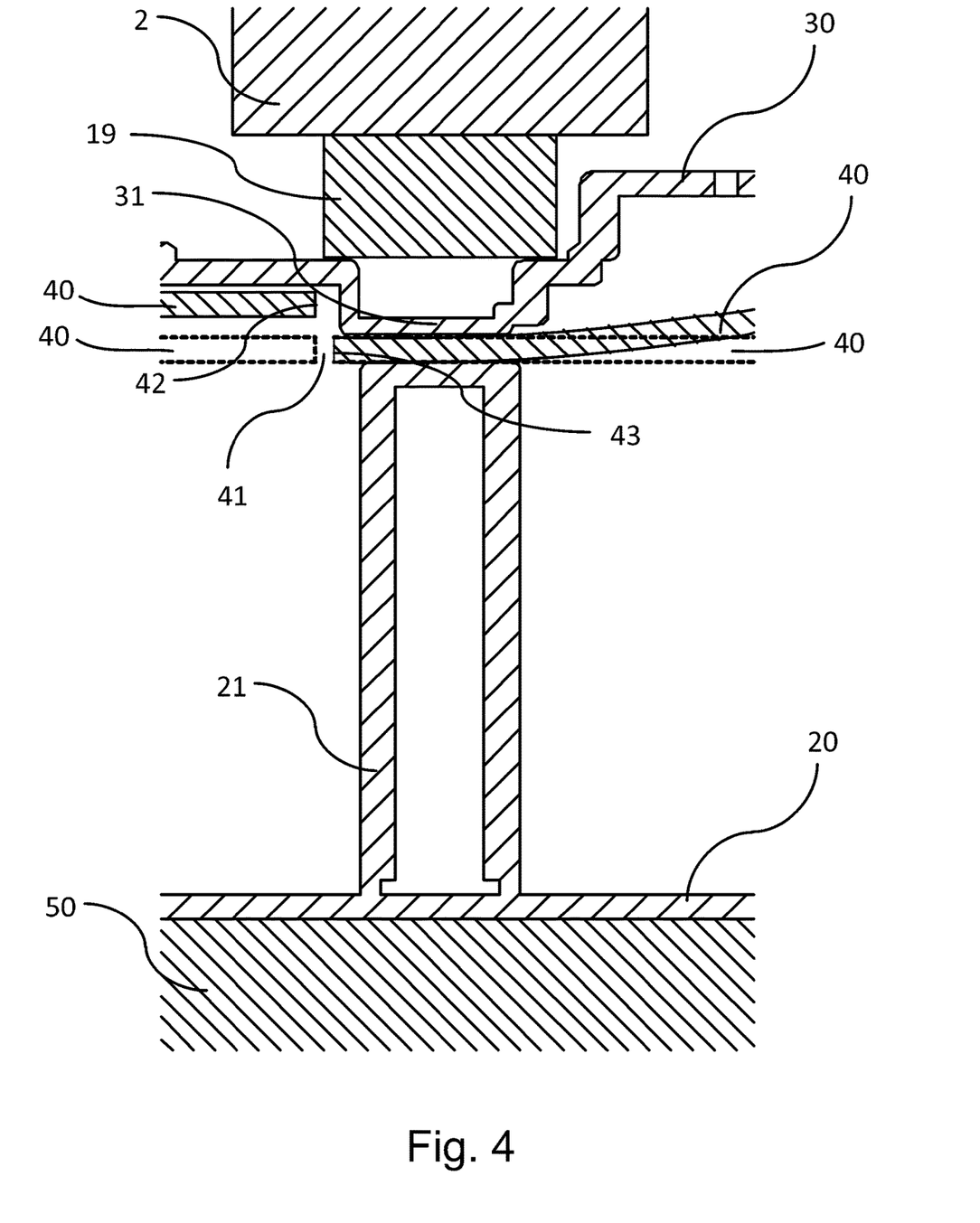
FIG. 4 is a schematic drawing for describing the manner in which a printed circuit board in a conventionally structured image forming apparatus is impacted by the fall of the apparatus.

FIG. 4 is a sectional view of the circuit board 40, and its adjacencies, in packaged the image forming apparatus 1, at plane 100 which is perpendicular to the axial line of the photosensitive drum 3 and coincides with the hole 41, as seen from the direction indicated by arrow mark 101. Referring to FIG. 4, the process cartridge 2 is in the state in which it is after it was installed into the image forming apparatus 1 along the insertion-extraction guides (unshown) of the left frame 30 described above. A boss 19 is for guiding the process cartridge 2 along the insertion-extraction guides 18a and 18b of the right frame 55, and those of the left frame 30, when the process cartridge 2 is installed into, or uninstalled from the image forming apparatus 1. The boss 19 shown in FIG. 4 is in the position in which it is after the proper installation of the photosensitive drum 3 into the image forming apparatus 1. By the way, the inside of the boss 19 functions as a portion for rotatably supporting axle of the photosensitive drum 3. Therefore, in a case where the image forming apparatus 1 happens to fall with its left frame 30 being on the bottom side, the weight of the photosensitive drum 3 in the process cartridge 2 is borne by a damping portion (abutting portion)31, which is protrusive from the left frame 30, and transmits the impact resulting from the fall to the circuit board 40. On the other hand, the left cover 20 is provided with a damping portion (abutting portion) 21, which is protrusive from the left cover 20 and is correspondent in position to the damping portion 30 of the left frame 30.

Referring to FIG. 4, in this embodiment, in order to protect the circuit board 40 having the hole 41, the circuit board 40, and its adjacencies, are structured so that, the damping portion 31 which is protrusive from the left frame 30 squarely opposes the damping portion 21 which is protrusive from left cover 20, with the presence of the circuit board 40 between the two damping portions 31 and 21, as in the conventionally structured image forming apparatus disclosed in Japanese Laid-open Patent Application No. H08-335785. Thus, as the packaged image forming apparatus 1 falls, the space between the packaging insert 50 positioned on the outward side of the left cover 20, and the process cartridge 2 vanishes, and therefore, the impact from the photosensitive drum 3 in the process cartridge 2 is transmitted to the packaging insert 50, which softens the impact by the reactionary force generated by the packaging insert 50 as it is squashed.

However, in the case of the structural arrangement shown in FIG. 4, the damping portion 31 which is protrusive from the left frame 30, and the damping portion 21 which is protrusive from the left cover 20 oppose each other across the portion of substrate of the circuit board 40, which does not have the hole 41. That is, even though the damping portion 31 and the damping portion 21 oppose each other across the portion of substrate of the circuit board 40, which has an edge 43 of the hole 41, the damping portion 31 and the damping portion 21 do not oppose each other across the portion of substrate of the circuit board 40, which has an edge 42 of the hole 41. Therefore, if the packaged image forming apparatus 1 falls with the left frame 30 being on the bottom side when circuit board 40 and its adjacencies are in the state shown in FIG. 4, the circuit board 40 changes in state from the one indicated by the broken line to the one indicated hatching. That is, in a case where the impact from the fall transmits to the adjacencies of the hole 41 of substrate of the circuit board 40 when the circuit board 40 and its adjacencies is in the state shown in FIG. 4, the edge 42 side of the substrate of the circuit board 40, and the edge 43 side become different from each other in the manner and amount of deformation. Therefore, it is possible that the stress resulting from the impact from the fall concentrates to the adjacencies of an edge 44 (FIG. 3) of the hole 41 in terms of the direction in which the hole 41 extends, damaging thereby the circuit board 40.

Figure 5:
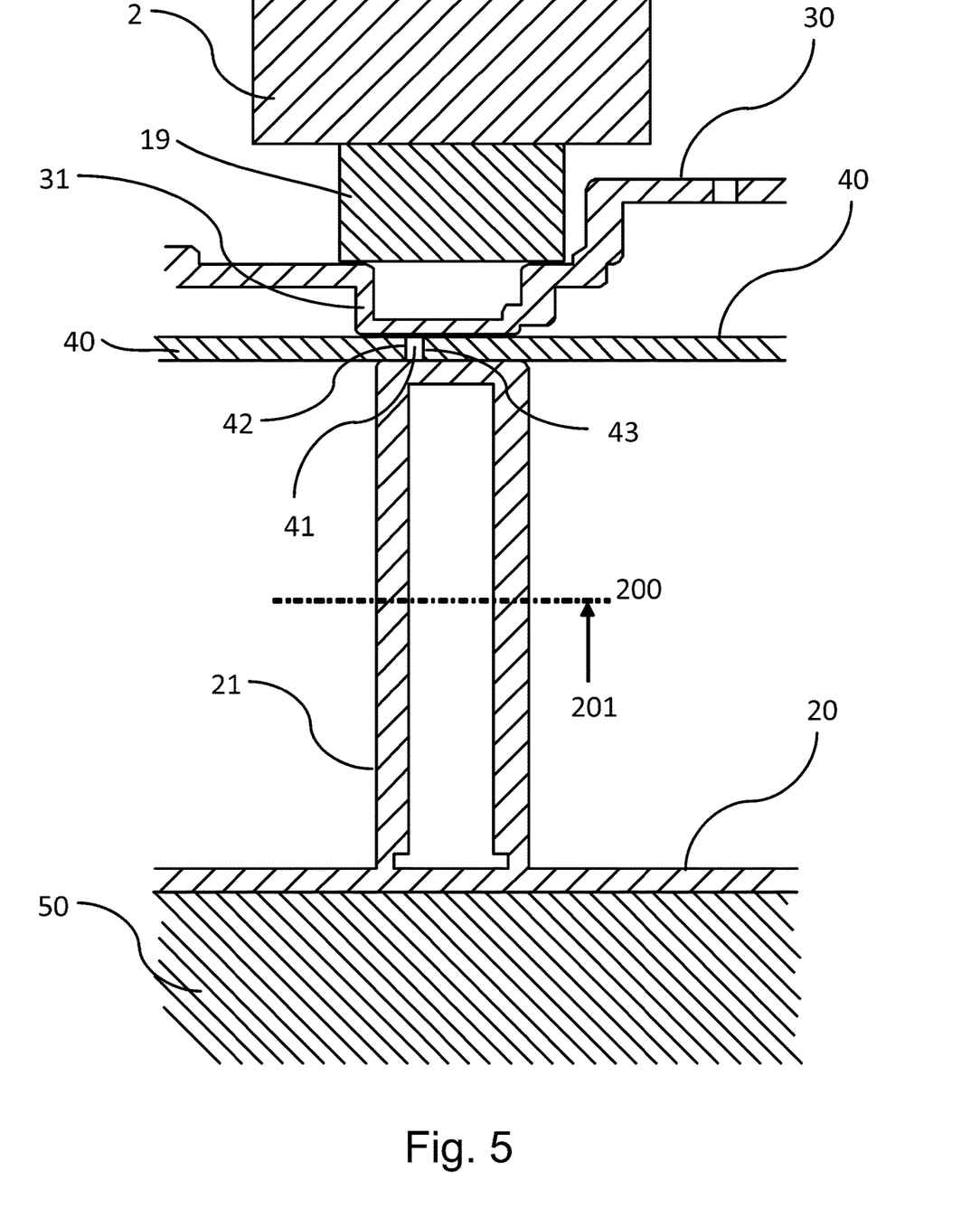
FIG. 5 is a schematic sectional view of the printed circuit board, and its adjacencies, in a packaged image forming apparatus in the first embodiment; it shows the path through which the impact from the fall of the image forming apparatus transmits.

Next, the positional relationship among the hole 41 of the substrate of the circuit board 40, the damping portion 31 of the left frame 30 of the main assembly frame 26, and the damping portion 21 of the left cover 20, in this embodiment, is described. FIG. 5 is a sectional view of the circuit board 40, and its adjacencies, in the packaged image forming apparatus 1 in this embodiment, at plane 100 which is perpendicular to the axial line of the photosensitive drum 3 and coincides with the hole 41, as seen from the direction indicated by arrow mark 101. FIG. 5 is different from FIG. 4 in that the damping portion 31 which is protrusive from left frame 30, and the damping portion 21 which is protrusive from the left cover 20, oppose each other across the portion of substrate of the circuit board 40, which includes the hole 41. Otherwise, the portion of the image forming apparatus 1 shown in FIG. 5 are the same in structure as those shown in FIG. 4. What characterizes this embodiment of the present invention is that the hole 41 is positioned so that in terms of the direction (left-right direction) parallel to the rotational axis of the photosensitive drum 3, the damping portion 31 (first damping portion) is on one side of the hole 41, and damping portion 21 (second damping portion) is on the other side of the hole 41. Further, the portion of flat portion of surface area of the damping portion 21, which opposes the circuit board 40, and the portion of flat portion of surface area of the damping portion 31, which opposes the circuit board 40, are parallel to the corresponding flat surfaces of the circuit board 40, which oppose the damping portion 31 and the damping portion 21, respectively. Therefore, as the packaged image forming apparatus 1 falls, the space between the packaging insert 50 placed on the outward side of the left cover 20, and the process cartridge 2, is eliminated. Therefore, as the impact from the process cartridge 2 transmits to the left frame 30, the portion of the circuit board 40, which is on the edge 42 side, and the portion of the circuit board 40, which is on the edge 43 side, are roughly the same in the amount of deformation caused by the impact transmitted from the damping portion 31. Therefore, it can be avoided that the stress resulting from the impact concentrates to an end portion 44 of the hole 41 of the substrate of the circuit board 40. Therefore, it becomes possible for the impact which results as the packaged image forming apparatus 1 falls, to be transmitted to left cover 20, and then, to the packaging insert 50, by way of the circuit board 40, making it possible to soften the impact by the reactionary force which generates as the packaging insert 50 is made to collapse by the impact.

It sometimes occurs that the vibrations and/or fall of the image forming apparatus 1, which occurs during the transportation of the image forming apparatus 1, causes the damping portion 31 and the damping portion 21 to rub, and/or collide with, the area of the circuit board 40, across which the damping portion 31 and the damping portion 21 oppose each other. Therefore, the circuit patterns and circuit components should not be placed on the area of substrate of the circuit board 40, across which the damping portion 31 and the damping portion 21 oppose each other, and in the adjacencies of the area. In this embodiment, however, the portions of substrate of the circuit board 40, on which circuit patterns and circuit components cannot be placed because of the constraints which come from the design of the circuit board 40, are utilized as the area through which the impact from the fall is transmitted. Therefore, it becomes unnecessary for the circuit board 40 to be provided with areas dedicated to the transmission of the impact from the fall, which were necessary in the case of a conventionally designed circuit board. That is, this embodiment makes it possible to prevent the stress from the impact which occurs as the image forming apparatus 1 falls, from concentrating to the end portion 44 of the hole 41, without increasing the circuit board 40 in size. Therefore, this embodiment makes it possible to reduce in size, even the circuit board 40, which is likely to catch the impact generated by a heavy object like the photosensitive drum 3 as the image forming apparatus 1 falls, by providing the substrate of the circuit board 40 with the hole 41.

Figure 6:
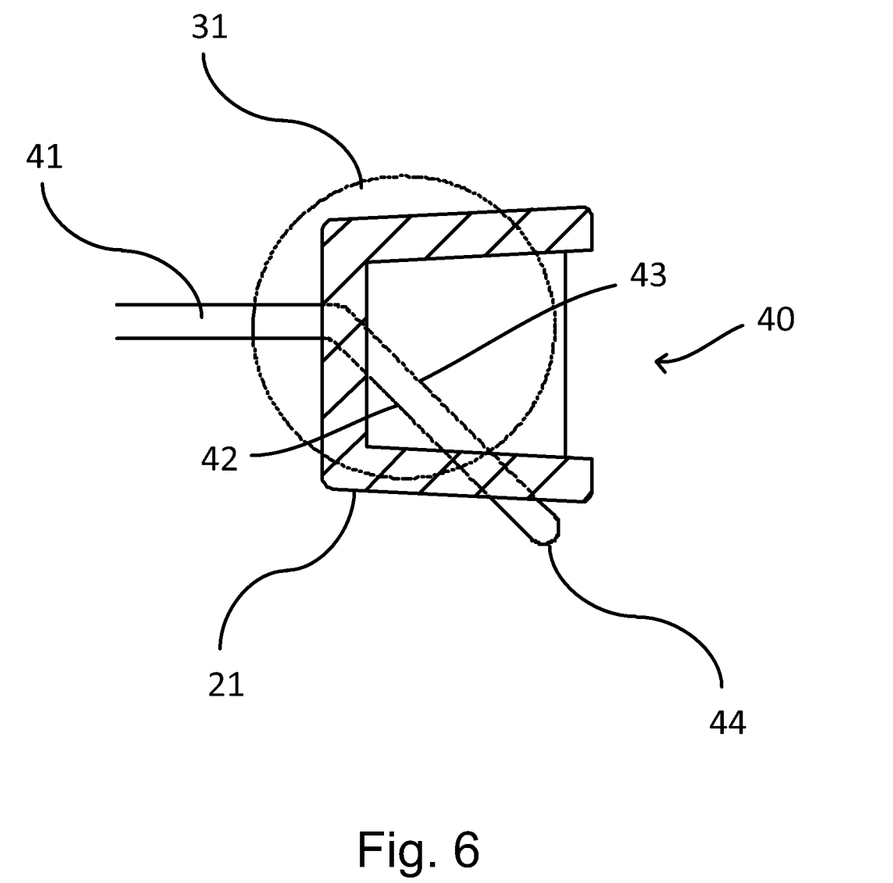
FIG. 6 is a schematic drawing for describing the positioning of the damping portion in the first embodiment.

FIG. 6 is a see-through view of a combination of the damping portion 21 of left cover 20, the hole 41 of the circuit board 40, and the damping portion 31 of the left frame 30, as seen at plane 200 which is perpendicular to the axial line of the photosensitive drum 3 and coincides with damping portion 21 shown in FIG. 5, in the direction indicated by arrow mark 201 (upward). Referring to FIG. 6, damping portion 21 (hatched portion in drawing) which extends toward the circuit board 40 from the left cover 20 has a rib, which is roughly U-shaped in cross section. The portion of surface area of damping portion 21, which is adjacent to the circuit board 40, is flat and parallel to the surface of the circuit board 40, and which is in connection to the rib, which is roughly U-shaped in cross section. As is shown in FIG. 6, the flat portion of surface of the damping portion 21, which is adjacent to circuit board 40, opposes the area of the circuit board 40, which has both the portion of the circuit board 40, which has an edge 42 (indicated by dotted line), the portion of the circuit board 40, which has an edge 43 (indicated by dotted line).

On the other hand, the damping portion 31 of the left frame 30 is in the form of a circular rib (indicated by dotted line). The cylindrical portion of surface area of the damping portion 31, which is in the adjacencies of the circuit board 40, is flat and parallel to the surface of the circuit board 40. Also referring to FIG. 6, the portion of surface area of the damping portion 31, which is in the adjacencies of the circuit board 40 and opposes the circuit board 40, opposes the area of the circuit board 40, which includes the portion of the circuit board 40, which has the edge 42 (indicated by dotted line), and the area of the circuit board 40, which has the edge 43 (indicated by dotted line), with the presence of the hole 41 between the two areas. Moreover, referring to FIG. 6, as seen in the direction parallel to the axial line of the photosensitive drum 3, the portion of surface area of the damping portion 31, which is in the adjacencies of the circuit board 40 and opposes the circuit board 40, and the portion of surface area of the damping portion 21, which is in the adjacencies of the circuit board 40 and opposes the circuit board 40, overlap with the area of the circuit board 40, which includes the hole 41. Therefore, the impact which occurs as the image forming apparatus 1 falls is transmitted from the damping portion 31 to the damping portion 21 by way of the circuit board 40. However, the impact transmitted from the damping portion 31 does not make the portion of the circuit board 40, which is on one side of the hole 41, and the portion of the circuit board 40, which is on the other side of the hole 41, substantially different in the amount of deformation. Therefore, it is possible to avoid the problem that the stress from the impact generated by a heavy object such as photosensitive drum 3 concentrates to the edge 44 of the hole 41.

In this embodiment, in order to provide the circuit board 40 with sufficient creepage distance to prevent the occurrence of leakage current, the hole 41, that is, where circuit patterns cannot be placed because of the design of the circuit board 40, was utilized. This embodiment is not intended to limit the present invention in scope. For example, an image forming apparatus may be designed so that the damping portion of the left frame 30 and that of the left cover 20 oppose a round hole and an elongated hole, such as a positioning hole, used for manufacturing of the circuit board 40. Such an application of the present invention can also provide effects similar to those described above.

Further, in this embodiment, the circuit board 40 was on the left surface of the main assembly frame 26. However, this embodiment is not intended to limit the present invention in scope. For example, in a case where the circuit board 40 is on the right surface of the main assembly frame 26, the present invention is applicable by designing image forming apparatus 1 so that the hole 41 of the circuit board 40 opposes the damping portion of the right frame 55, and the damping portion of the right cover 15. Moreover, even if circuit board 40 is on the surface area of the main assembly frame 26, as image forming apparatus 1 falls backward, the impact resulting from the fall transmits to the circuit board 40 from a heavy object such as fixing device 11. Therefore, structuring image forming apparatus 1 as described above can reduce the circuit board 40 in size while preventing the circuit board 40 from being damaged.

As described above, this embodiment can prevent a printed circuit board, the substrate of which has a hole, from being damaged by the impact which occurs as the image forming apparatus 1 falls.

Embodiment 2

In the first embodiment, the portion of the surface area of the damping portion, which opposes the hole of the substrate of the circuit board, is flat and straddles the hole. In the second embodiment, the portion of the surface area of the damping portion, which opposes the circuit board, has multiple (two) flat portions, each of which does not straddle the hole. By the way, the image forming apparatus in this embodiment is similar to image forming apparatus 1 in the first embodiment, being the same as the one in the first embodiment in the position of the circuit board. Thus, the structural components of the image forming apparatus in this embodiment, and the portions thereof, which are the same in structure as the counterparts in the first embodiment are given the same referential codes as those given to the counterparts, and are not going to be described.

[Positional Relationship Among Hole of Substrate of Circuit Board, Main Assembly Frame, and Damping Portions of Exterior Cover]

In the first embodiment described above, the portion of surface area of damping portion, which opposes the hole of the circuit board, was such a flat surface that extends across the hole of the circuit board. However, in a case where an image forming apparatus is structured so that the damping portion has only one portion which opposes the circuit board, it is sometimes impossible to provide the circuit board with a sufficient creepage distance, or the like, to place the damping portion 31 and the damping portion 21 close to the circuit board 40, making it necessary to increase the image forming apparatus 1 in the gap between the circuit board 40 and the damping portion 31, and/or that between the circuit board 40 and the damping portion 21. Increasing the image forming apparatus 1 in these gaps increases the amount by which the circuit board 40 is made to deform by the impact resulting from the fall of the image forming apparatus 1, which in turn makes it possible for the circuit board 40 to be damaged by the fall. Next, therefore, a structural arrangement which is to be used in a case where providing the circuit board 40 with the hole 41 makes it impossible to provide the circuit board 40 with sufficient creepage distance is described.

Figure 7:
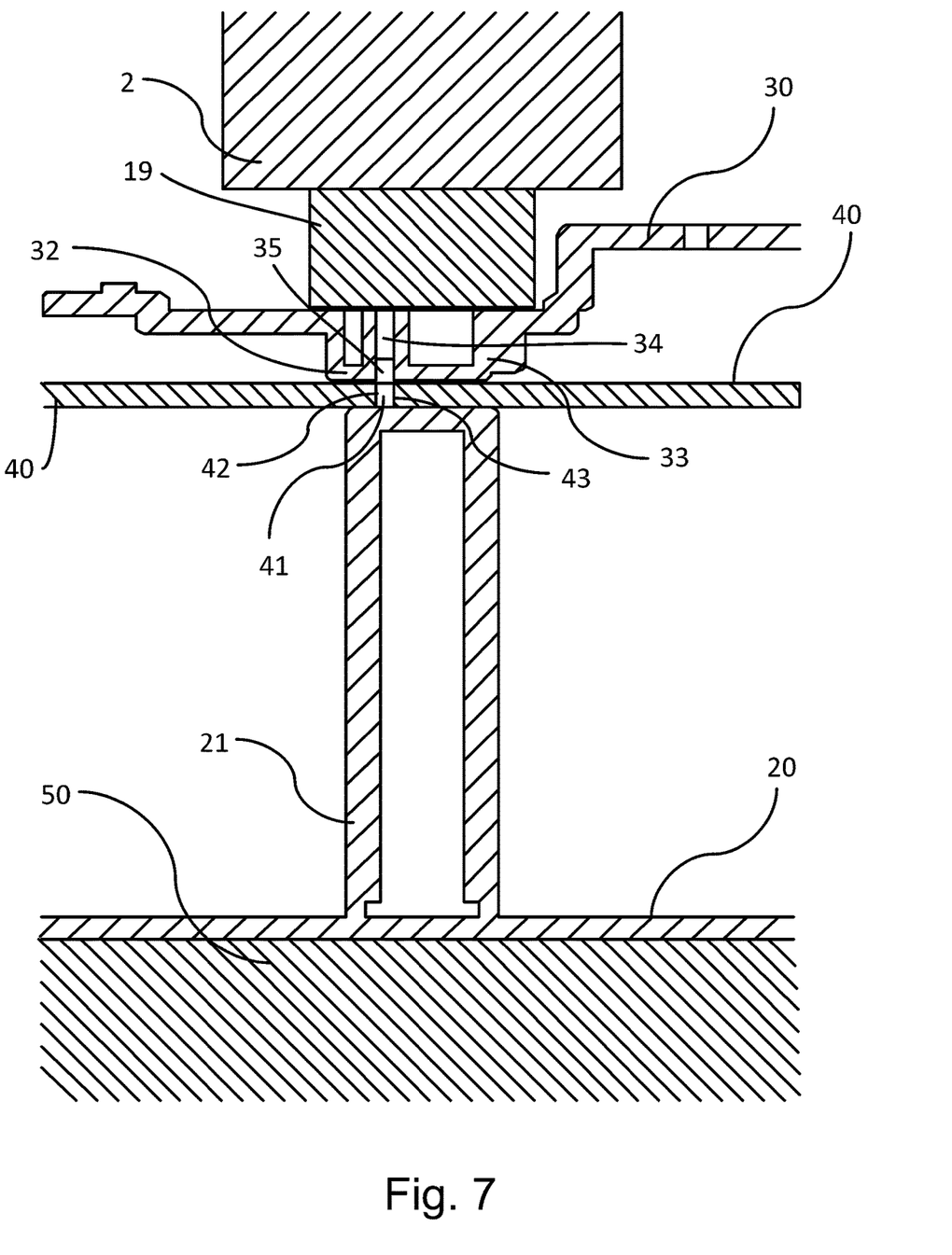
FIG. 7 is a sectional view of a combination of the printed circuit board, and its adjacencies, in the packaged image forming apparatus in the second embodiment; it shows the path through which the impact from the fall of the image forming apparatus transmits.

FIG. 7 is a sectional view of the hole 41 of the circuit board 40, and its adjacencies, in a case where the left frame 30 side of the circuit board 40 cannot be provided with a sufficient creepage distance. FIG. 7 is similar to FIG. 5 in the structure of the circuit board 40 which has the hole 41, and also, in the structure of the damping portion 21 of left cover 20. Referring to FIG. 5, in the first embodiment, the left frame 30 was provided with a single damping portion (damping portion 31), the portion of the surface area of which was monolithic and straddled hole 41. In comparison, the left frame 30, in this embodiment, shown in FIG. 7 is provided with two damping portions 32 and 33, which are in the adjacencies of the edge 42 side of the circuit board 40, and the edge 43 side of the circuit board 40, respectively. By the way, the distance between the portion of the surface area of the damping porting 32, which opposes the circuit board 40, and the circuit board 40, and the distance between the portion of the surface area of the damping portion 33, which opposes the circuit board 40, and the circuit board 40, are the same. That is, like those in FIG. 5 (first embodiment), the flat surface of the damping portion 32, which opposes the circuit board 40, and the flat surface of the damping portion 33, which opposes the circuit board 40, are parallel to the surface of the circuit board 40, which face the flat surface of the damping portion 33, which opposes the circuit board 40, are parallel to the surface of the circuit board 40 which opposes damping portions 32 and 33. Moreover, the damping portions 32 and 33 are in rigid connection to each other through a connective portion 34. There is provided recess 35 between a connective portion 34 and the hole 41.

The damping portion 32 opposes the damping portion 21 of the left cover 20, with the presence of the portion of the circuit board 40, which has the edge 42, between two damping portions 32 and 21. The damping portion 33 opposes the damping portion 21 of the left cover 20, with the presence of the portion of the circuit board 40, which has the edge 43, between two damping portions 33 and 21. Further, damping portion 32 and 33 are rigidly connected to each other by the connective portion 34. Therefore, as image forming apparatus 1 falls, and the impact caused by the process cartridge 2 transmits to the left frame 30, the impact is transmitted to the edge 42 side of the circuit board 40, and edge 43 side of circuit board 40 through damping portions 32 and 33, respectively. Thus, the edge 42 side of the circuit board 40 and the edge 43 side of the circuit board 40 become roughly the same in the amount of deformation. Therefore, it can be avoided that the stress caused by the impact concentrates to the edge portion 44 of the hole 41. Further, the impact from the fall can be transmitted to the packaging insert 50 by way of circuit board 40.

Also referring to FIG. 7, the creepage distance of the left frame 30 side of the circuit board 40 is the shortest distance electric current flows from where the damping portion 32 is grounded to the circuit board 40, to where the damping portion 33 is grounded to the circuit board 40, through the connective portion 34. Therefore, the creepage distance of the left frame 30 side of the circuit board 40 is determined by the distance of the connective portion 34 from the circuit board 40 (that is, length (depth) of a recess 35), and the distance between the damping portion 32 and the damping portion 33 (that is, width of the recess 35). That is, the creepage distance of the left frame 30 side of the circuit board 40 is: width of the recess 35+length (depth) of the recess 35×2.

Figure 8:
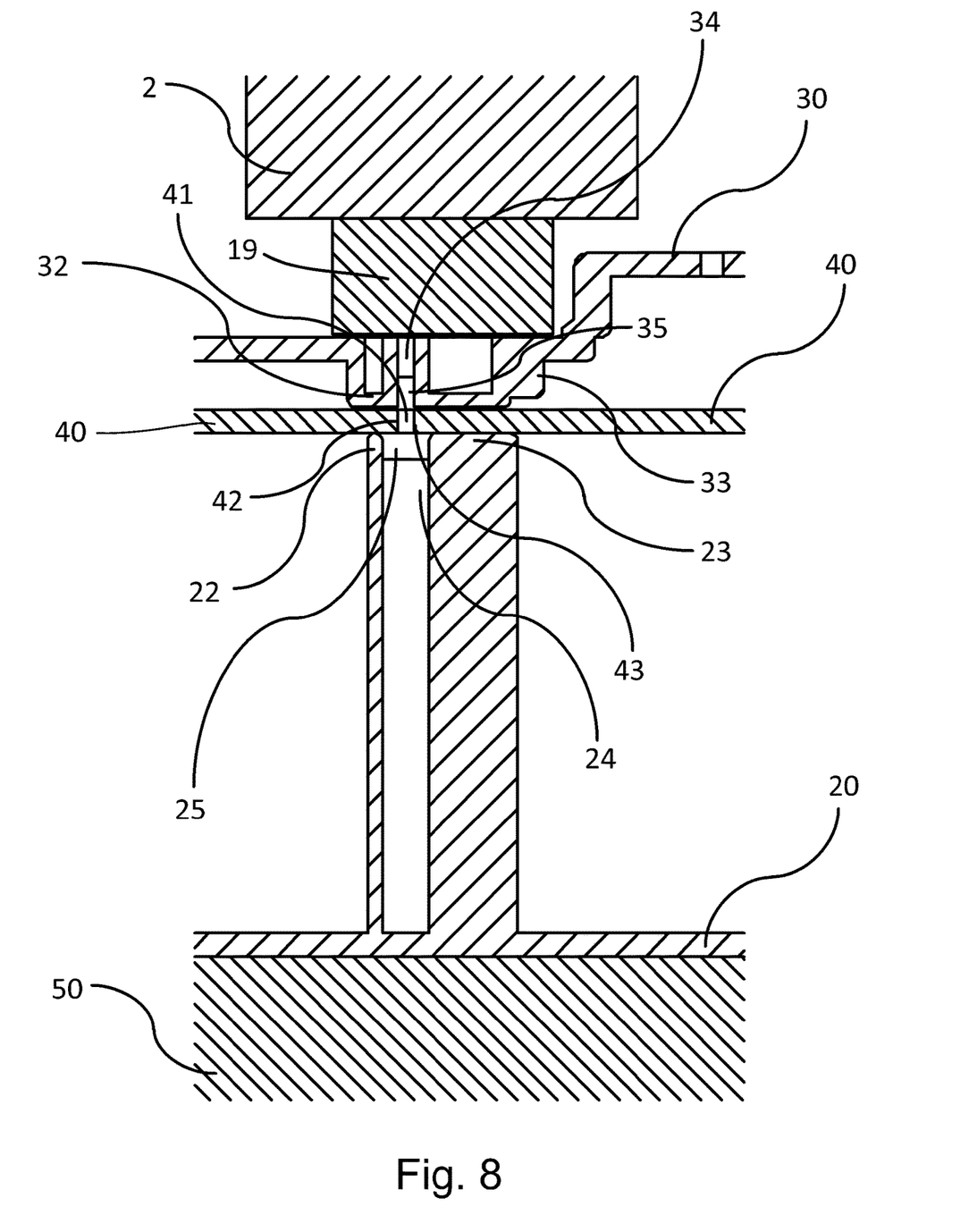
FIG. 8 is a sectional view of a combination of the printed circuit board, and its adjacencies, in the packaged image forming apparatus in the second embodiment; it shows the path through which the impact from the fall of the image forming apparatus transmits.

FIG. 8 is a sectional view of the hole 41 of the substrate of the circuit board 40, and its adjacencies, when the left cover 20 side of the circuit board 40 cannot be provided with creepage distance. It shows the structures of the hole 41 and its adjacencies. The circuit board 40 provided with the hole 41, the damping portions 32 and 33 of the left frame 30, the connective portion 34, the recess 35 in FIG. 8 are the same in structure as the counterparts in FIG. 7. The damping portion 21 shown in FIG. 7 had only one flat surface which opposes the circuit board 40. In comparison, the left cover 20 shown in FIG. 8 is provided with two damping portions 22 and 23, which are positioned close to the edge 42 side of the circuit board 40, and the edge 43 side of the circuit board 40, respectively. By the way, the distance between the surface of the damping portion 22, which opposes the circuit board 40, and the corresponding surface of circuit board 40, and the distance between the surface of the damping portion 23, which opposes the circuit board 40, and the corresponding surface of the circuit board 40, are the same. That is, the flat surface of the damping portion 22, which opposes circuit board 40, and the flat surface of the damping portion 23, which opposes the circuit board 40, are parallel to the corresponding surface of the circuit board 40, like those of the damping portions 32 and 33, respectively, shown in FIG. 7. Moreover, the damping portions 22 and 23 are rigidly connected to each other by the connective portions 24. There is provided the recess 25 between the connective portion 24 and the hole 41.

The damping portion 32 opposes the damping portion 22, with the presence of the circuit board 40 with the hole 41 between the damping portions 32 and 22, and the damping portion 33 opposes the damping portion 23 of the left cover 20, with the presence of the circuit board 40 with hole 41 between the damping portions 33 and 23. Further, the damping portions 32 and 33 are rigidly connected to each other by the connective portion 34. The damping portions 22 and 23 are connected to each other by the connective portion 24. Therefore, the edge 42 side of the circuit board 40 and the edge 43 side of the circuit board 40 are roughly the same in the amount by which they are displaced by the impact transmitted thereto through the damping portions 32 and 33 as the left frame 30 is subjected to the impact caused by the process cartridge 2 as image forming apparatus 1 falls. Therefore, it can be avoided that the stress resulting from the impact concentrates to the portion of the circuit board 40, which is adjacent to the edge 44 of the hole 41. Further, it becomes possible for the impact which is transmitted through the damping portions 32 and 33 as image forming apparatus 1 falls, to be transmitted to the packaging insert 50 through the circuit board 40, and the damping portions 22 and 23 of left cover 20.

In the structure shown in FIG. 8, the creepage distance of the circuit board 40 on the left cover 20 side is the shortest distance electric current flows from where the damping portion is grounded to the circuit board 40, to where the damping portion 23 is grounded to the circuit board 40, through the connective portion 24. Therefore, the creepage distance of the left cover 20 side of the circuit board 40 is determined by the distance of the connective portion 24 from the circuit board 40 (that is length (depth) of the recess 25), and the distance between the damping portions 22 and 23 (that is, width of the recess 25). That is, the creepage distance of the left cover 20 side of the circuit board 40 is: width of the recess 25+length (depth) of the recess 25×2.

By the way, in this embodiment, the present invention was applied to the image forming apparatus 1 structured so that if the damping portions are positioned close to circuit board 40, the left frame 30 side of the circuit board 40, and left cover 20 side of the circuit board 40, cannot be provided sufficient creepage distance. Referring to FIGS. 7 and 8, if it is only the left cover 20 side of the circuit board 40 that cannot be provided with creepage distance, the left cover 20 side was provided with the damping portions 22 and 23, the connective portion 24, and the recess 25, which were described with reference to FIG. 8, whereas the left frame 30 side has only to be provided with the damping portion 31 in the first embodiment. Further, referring to FIG. 8, in this embodiment, each of the left frame 30 side and left cover 20 side was provided with the damping portions 32 and 33, and the damping portions 22 and 23. However, this embodiment is not intended to limit the present invention in scope. For example, even if the number of the damping portions of the left frame 30, and that of the left cover 20, are no less than 3, effects similar to those described above are obtainable, provided that the number of the damping portions which oppose the damping portions of left frame 30 and those of the left cover 20, with the presence of the circuit board 40 between two sets of damping portions, is no less than two.

Even if the damping portions 32 and 33 of the left frame 30, and the damping portions 22 and 23 of the left cover 20, are close to the circuit board 40, the creepage distance required of the circuit board 40 can be obtained by provision of the recesses 35 and 25 as in this embodiment. With the provision of the recesses 35 and 25, the circuit board 40 is reduced in the amount by which it is made to deform by the impact from the fall of the image forming apparatus 1. Therefore, the impact from the fall is efficiently transmitted from the damping portions 32 and 33 to the damping portions 22 and 23. Therefore, it is possible to protect the circuit board 40 from the impact from the fall.

Further, in the embodiments described above, the image forming apparatus to which the present invention was applied was a monochromatic image forming apparatus, which is only one in the number of the process cartridge 2 to be installed in the apparatus. However, these embodiments are not intended to limit the present invention in scope. For example, the present invention is also applicable to an image forming apparatus for forming a full-color toner image. In such a case, yellow, magenta, cyan, and block toners are used as developers, and the number of cartridges which are to be installed in the image forming apparatus are four. Also in the embodiments described above, the image forming apparatus was an ordinary printer. However, the present invention is also applicable to a copying machine, a facsimileing machine, a multifunction image forming apparatus capable of performing two or more functions of the preceding image forming apparatus, as well.

As described above, the present invention can prevent a printed circuit board in an image forming apparatus from being damaged by the fall of the apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-143731 filed on Aug. 27, 2020, which is hereby incorporated by reference herein in its entirety.

What is claimed is:

1. An image forming apparatus comprising:
an image forming portion configured to form an image on a recording material;
a frame, which is a part of a main assembly frame configured to support said image forming portion, extending along a predetermined plane;
a cover provided outside of said frame and extending along the predetermined plane; and
a circuit board, provided between said frame and said cover with respect to a direction perpendicular to the predetermined plane and extending along the predetermined plane, configured to control said image forming portion, said circuit board including an opening portion penetrating said circuit board,
wherein said frame includes a first abutting portion protruding toward said circuit board and said cover includes a second abutting portion protruding toward said circuit board,
wherein said first abutting portion and said second abutting portion are opposite to each other via said circuit board and positioned in an area where said opening portion of said circuit board is sandwiched therebetween with respect to the direction perpendicular to the predetermined plane,
wherein said image forming portion includes an image bearing member configured to be formed an electrostatic latent image thereon,
wherein said circuit board is positioned at one side of said image bearing member with respect to a rotational axis of said image bearing member and dispose between said frame and said cover, and
wherein said opening portion is positioned in a position overlapping said image bearing member, as seen from a direction parallel to the rotational axis of said image bearing member.

2. An image forming apparatus according to claim 1, wherein tips of said first abutting portion and said second abutting portion include plane portions parallel to a surface of said circuit board, respectively.

3. An image forming apparatus according to claim 1, wherein neither a circuit patten nor a circuit part is provided near said opening portion.

4. An image forming apparatus according to claim 1, wherein said first abutting portion transmits an impact from said frame to said second abutting portion opposite to said first abutting portion via said circuit board.

5. An image forming apparatus according to claim 2, wherein both said plane portion of said first abutting portion and said plane portion of said second abutting portion are extending along a surface of said circuit board over the area where said opening portion is sandwiched therebetween.

6. An image forming apparatus comprising:
an image forming portion configured to form an image on a recording material;
a frame, which is a part of a main assembly frame configured to support said image forming portion, extending along a predetermined plane;
an exterior cover provided outside of said frame and extending along the predetermined plane; and a circuit board, provided between said frame and said cover with respect to a direction perpendicular to the predetermined plane and extending along the predetermined plane, configured to control said image forming portion, said circuit board including an opening portion penetrating said circuit board, wherein said frame includes a first abutting portion protruding toward said circuit board and said cover includes a second abutting portion protruding toward said circuit board, and wherein said first abutting portion and said second abutting portion are opposite to each other via said circuit board and positioned in an area where said opening portion of said circuit board is sandwiched therebetween with respect to the direction perpendicular to the predetermined plane.

7. An image forming apparatus according to claim 6, wherein tips of said first abutting portion and said second abutting portion include plane portions parallel to a surface of said circuit board, respectively.

8. An image forming apparatus according to claim 6, wherein neither a circuit patten nor a circuit part is provided near said opening portion.

9. An image forming apparatus according to claim 6, wherein said first abutting portion transmits an impact from said frame to said second abutting portion opposite to said first abutting portion via said circuit board.

10. An image forming apparatus according to claim 6, wherein said image forming portion includes an image bearing member configured to be formed an electrostatic latent image thereon, wherein said circuit board is positioned at one side of said image bearing member with respect to a rotational axis of said image bearing member and dispose between said frame and said cover, and wherein said opening portion is positioned in a position overlapping said image bearing member with respect to the rotational axis of said image bearing member.

11. An image forming apparatus according to claim 7, wherein both said plane portion of said first abutting portion and said plane portion of said second abutting portion are extending along a surface of said circuit board over the area where said opening portion is sandwiched therebetween.

12. A system comprising:
a packaging insert; and
an image forming apparatus, the image forming apparatus comprising:
an image forming portion configured to form an image on a recording material;
a frame, which is a part of a main assembly frame configured to support said image forming portion, extending along a predetermined plane;
an exterior cover provided outside of said frame and extending along the predetermined plane, the packaging insert being positioned on the outward side of the exterior cover; and
a circuit board, provided between said frame and said cover with respect to a direction perpendicular to the predetermined plane and extending along the predetermined plane, configured to control said image forming portion, said circuit board including an opening portion penetrating said circuit board, wherein said frame includes a first abutting portion protruding toward said circuit board and said cover includes a second abutting portion protruding toward said circuit board, and wherein said first abutting portion and said second abutting portion are opposite to each other via said circuit board and positioned in an area where said opening portion of said circuit board is sandwiched therebetween with respect to the direction perpendicular to the predetermined plane.

13. A system according to claim 12, wherein tips of said first abutting portion and said second abutting portion include plane portions parallel to a surface of said circuit board, respectively.

14. A system according to claim 12, wherein neither a circuit patten nor a circuit part is provided near said opening portion.

15. A system according to claim 12, wherein said first abutting portion transmits an impact from said frame to said second abutting portion opposite to said first abutting portion via said circuit board.

16. A system according to claim 12, wherein said image forming portion includes an image bearing member configured to be formed an electrostatic latent image thereon, wherein said circuit board is positioned at one side of said image bearing member with respect to a rotational axis of said image bearing member and dispose between said frame and said cover, and wherein said opening portion is positioned in a position overlapping said image bearing member with respect to the rotational axis of said image bearing member.

17. A system according to claim 13, wherein both said plane portion of said first abutting portion and said plane portion of said second abutting portion are extending along a surface of said circuit board over the area where said opening portion is sandwiched therebetween.

* * * * *